United States Patent [19]
Baldi et al.

[11] Patent Number: 4,703,552
[45] Date of Patent: Nov. 3, 1987

[54] FABRICATING A CMOS TRANSISTOR HAVING LOW THRESHOLD VOLTAGES USING SELF-ALIGNED SILICIDE POLYSILICON GATES AND SILICIDE INTERCONNECT REGIONS

[75] Inventors: Livio Baldi, Tortona; Giuseppe Corda, Saronno; Giulio Iannuzzi, Vimercate; Danilo Re, Bernareggio; Giorgio De Santi, Milan, all of Italy

[73] Assignee: SGS Microelettronica S.p.A., Agrate, Italy

[21] Appl. No.: 689,875

[22] Filed: Jan. 9, 1985

[30] Foreign Application Priority Data

Jan. 10, 1984 [IT] Italy ............................. 19086 A/84

[51] Int. Cl.$^4$ .................... H01L 21/265; H01L 21/28
[52] U.S. Cl. .................... 437/45; 148/DIG. 82; 357/42; 357/67; 437/57; 437/200
[58] Field of Search ............... 29/571, 576 B; 148/1.5, 148/175, 187; 357/42, 67

[56] References Cited

U.S. PATENT DOCUMENTS

| | | | |
|---|---|---|---|
| 4,333,099 | 6/1982 | Tanguay et al. | 357/67 |
| 4,336,550 | 6/1982 | Medwin | 357/42 |
| 4,422,885 | 12/1983 | Brower | 148/1.5 |
| 4,519,126 | 5/1985 | Hsu | 29/571 |
| 4,528,744 | 7/1985 | Shibata | 29/571 |
| 4,551,908 | 11/1985 | Nagasawa et al. | 29/571 |
| 4,558,507 | 12/1985 | Okabayashi et al. | 29/571 |
| 4,561,170 | 12/1985 | Doering et al. | 29/571 |
| 4,587,710 | 5/1986 | Tsao | 29/571 |

OTHER PUBLICATIONS d'Heurle et al., Jour. Appl. Phys. 53, (1982) 8766.
Alperin et al., IEEE Trans. Electron Devices ED32, (1985), 141.
Wang et al., Thin Solid Films, 74, (1980), 239.

*Primary Examiner*—Upendra Roy
*Attorney, Agent, or Firm*—Harry M. Weiss & Associates

[57] ABSTRACT

The method provides for the formation of a layer of metal silicide on the gate layer of polycrystalline silicon and, for each transistor of the CMOS pair, the simultaneous doping of the active regions and the gate polycrystalline silicon. In the structure produced by this method, the gate electrodes are of polycrystalline silicon covered by metal silicide and the gate electrode of the n-channel transistor is doped with n-type material, while the gate electrode of the p-channel transistor is doped with p-type impurities. This enables the production of low threshold voltages for both transistors even in the case of very high integration densities.

5 Claims, 13 Drawing Figures

FABRICATING A CMOS TRANSISTOR HAVING LOW THRESHOLD VOLTAGES USING SELF-ALIGNED SILICIDE POLYSILICON GATES AND SILICIDE INTERCONNECT REGIONS

TECHNICAL FIELD

The present invention relates to integrated circuits of MOS (Metal Oxide Semiconductor) type and, more particularly to a method for the manufacture of pairs of complementary MOS (CMOS) transistors having silicon gates and a structure which may be obtained using this method.

BACKGROUND OF THE INVENTION

In the manufacture of integrated CMOS circuits having silicon gates it is difficult to simultaneously obtain a low threshold voltage and a small distance between the active drain and source regions in both transistors of the CMOS pair. Both of these characteristics are desirable for each transistor as they respectively enable the use of low supply voltages and the achievement of high integration densities and high speeds of response.

For an explanation of the measures which may be carried out in order to produce transistors having low threshold voltages, reference is made to the following relationship, quoted, for example, on page 333 of "Physics and Technology of Semiconductor Devices" by A. S. Grove, published by Wiley, which expresses, as a function of characteristic parameters, the threshold voltage of an MOS transistor:

$$V_T = V_{FB} + \phi_s \pm \frac{\sqrt{2K_s\epsilon_o q N \phi_s}}{C_o}$$

In this relationship the minus sign (−) relates to a p-channel transistor, the plus sign (+) to an n-channel transistor. The reference symbols used have the following meanings:

$V_T$ = threshold voltage
$V_{FB}$ = flat band voltage
$\phi_s$ = surface potential of the substrate
$K_s$ = relative permittivity of silicon
$\epsilon_o$ = electric constant
$q$ = electron charge
$N$ = concentration of doping agent in the region receiving the transistor
$C_o$ = capacitance, per surface unit, of the gate dielectric.

The threshold voltage $V_T$ is negative for the p-channel transistors and positive for the N-channel transistors.

The value of the threshold voltage of a transistor depends on the three terms appearing in the second side of the relationship given above. In the n-channel transistor of a conventional CMOS device the two terms $V_{FB}$ and $\phi_s$ have opposite signs ($V_{FB}$ is negative and $\phi_s$ is positive) and offset one another almost totally, as a result of which the threshold voltage essentially depends on the third term which may cause $V_T$ to assume the desired value by variation. On the other hand, in the case of the p-channel transistor of CMOS device the terms $V_{FB}$ and $\phi_s$ are both negative and the third term, which is positive, is preceded by the minus sign, as a result of which all three terms have a non-negligible effect on the value of $V_T$ and, if solely the third term varies, the absolute value of $V_T$ may not drop below $|V_{FB} + \phi_s|$.

In the CMOS devices constructed in accordance with the prior art, the third term is reduced in order to lower the threshold voltage of both transistors, in particular by reducing the N (concentration of doping agent in the region receiving the n-channel transistor and in the region receiving the p-channel transistor). In the n-channel transistor, as $V_T$ depends essentially on the third term, a small reduct'on of the N (concentration of doping agent) is sufficient to obtain a significant reduction of the threshold voltage. On the other hand, in the p-channel transistor it is necessary to considerably decrease the N (concentration of doping agent) in order to obtain a substantial reduction of $V_T$ However, in doing this, a drawback arises. In effect, by considerably reducing the concentration of doping agent in the substrate of the p-channel transistor there may arise, under certain drain and source polarization conditions, the formation of a deep conductive channel even at gate voltages which are lower than the threshold voltage (phenomenon known as punch-through) as a result of which it is impossible to control the transistor. This drawback is avoided by increasing the distance between the drain and source regions of the p-channel transistor. This measure involves, however, an increase in the length of this transistor and therefore a decrease in integration density and in the speed of response.

In order to reduce the value of the threshold voltage of the p-channel transistor of a CMOS device, it is possible to act on the flat band voltage $V_{FB}$. As mentioned above, $V_{FB}$ is negative, whereas it is advisable for it to be positive for a substantial decrease in the value of $V_T$. As known to persons skilled in the art, the flat band voltage is roughly proportional to the difference between the Fermi energy of the substrate receiving the transistor and the Fermi energy of the gate electrode. In a p-channel transistor, the substrate is of n-type, as a result of which the relative Fermi level is displaced towards the conduction band, i.e. towards high energy levels, and when this transistor forms part of a CMOS device with polycrystalline silicon gate electrodes, the polycrystalline silicon is normally of N+ type, as a result of which the relative Fermi level is even closer to the conduction band of that of the substrate. The Fermi energy of the substrate :s therefore lower than the Fermi energy of the gate electrode and the flat band voltage assumes a negative voltage, typically of approximately −250 mV. In order to bring it to a sufficiently high positive value, for example approximately 750 mV, the Fermi level of the gate electrode must be displaced towards the valency band, i.e. towards energy levels lower than that of the substrate and in order to do this the polycrystalline silicon must be heavily doped with p-type impurities (P+).

If a positive flat band voltage is used for the p-channel transistor, a sufficiently low threshold voltage is obtained, even with a relatively high concentration of doping agent in the substrate. This solution is therefore particularly advantageous in that it enables the achievement of a p-channel transistor having both a low threshold voltage and a small distance between the active regions.

However, if the gate electrodes of the p-channel transistors are doped with impurities of p-type and the n-channel transistors with impurities of n-type it is not possible to directly connect polycrystalline silicon electrodes belonging to complementary transistors, for example the gate electrodes of a CMOS inverter, since a diode is produced if two electrodes doped with impurities of opposite types are connected together. This drawback may be avoided if the electrodes are connected by a higher metallization layer, the construction of which is, however also disadvantageous as it requires the use of relatively extensive areas and makes the circuit design less flexible, as a result of which this system has not been used in practice and the polycrystalline silicon of both the transistors of the CMOS is doped with impurities of a single type of conductivity, i.e. of n-type.

By doping part of the polycrystalline silicon of the CMOS device with an acceptor element a further considerable advantage is obtained, i.e. the possibility of providing direct contacts between the polycrystalline silicon and the substrate regions both of n and p-type, for example the active drain regions of the two transistors, whilst in the devices of the prior art, as all the polycrystalline silicon is of n-type, this is only possible for the n-type regions. This situation is particularly advantageous as the direct contacts enable a saving of space and therefore greater miniaturization of the devices with respect to the contacts by means of metal interconnections.

SUMMARY OF THE INVENTION

The object of the present invention is to provide a CMOS integrated circuit with transistors both having a low threshold voltage and a small distance between the active regions, and therefore an integration density and a speed of response which are greater than those which may be obtained using known methods, and with direct contacts on both the transistors, without increasing the complexity of the manufacturing method.

This object is achieved using the method and the structure set out and characterised in the attached claims, and described purely by way of non-limiting example with reference to the attached drawings, in which the various Figures represent part of a silicon wafer in various processing stages.

DETAILED DESCRIPTION

Figure 1:
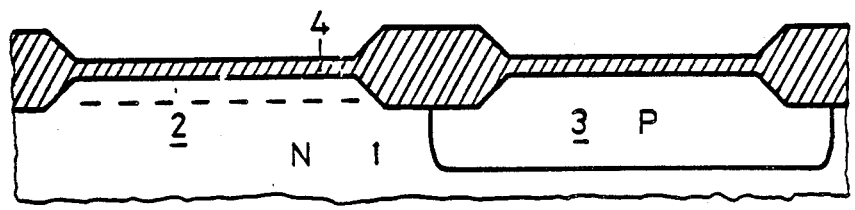
FIGS. 1 to 6 are cross-sections showing certain stages of a known method for the production of a CMOS inverter.

In the drawings, the same reference symbols are used for corresponding components. In addition, the letters N and P are used for doping respectively with impurities of N-type and with impurities of p-type. When this doping involves a high concentration of impurites, the reference letters N and P are followed by the plus (+) sign.

The structure shown in FIG. 1 is obtained by operations known to persons skilled in the art and is not therefore discussed in this description. It comprises a substrate 1 of monocrystalline silicon doped with n-type impurities, in which the region designed to receive the p-channel transistor of a CMOS device is shown by 2. In the substrate there is formed a region 3 doped with p-type impurities (called p-well), in which the n-channel transistor of the CMOS device is obtained. The substrate is covered by a layer 4 of silicon dioxide, the thickest portion of which forms the field dielectric and is disposed both between the regions 2 and 3 and externally to these regions, and the thinnest portion forms the gate dielectric and covers the regions 2 and 3 not covered by the thick field dielectric.

In the region 2, the concentration of n-type doping impurities is comparatively low (this situation is shown in FIG. 1 by a dashed line), typically of approximately $1.2 \times 10^{15}$ atoms/cm$^3$, so as to obtain a p-channel transistor having a low threshold (the threshold voltage is between $-0.7$ and $-1$ V), although in this situation the distance between the active regions of the transistor must be sufficiently large (typically approximately 3.5 $\mu$m) to prevent the phenomenon of punch-through as described above. The concentration of p-type impurities in the region 3, designed for the n-channel transistor is, however, fairly high, approximately $10^{16}$ atoms/cm$^3$ which enables a small drain-source distance to be obtained for this transistor.

Figure 2:
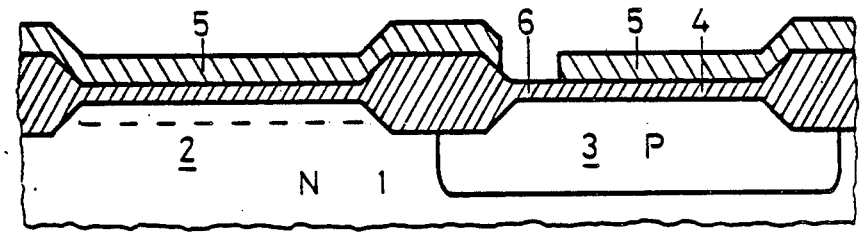

On this structure there is formed a mask of photosensitive varnish (photoresist), shown by 5 in FIG. 2, which almost completely covers the oxide layer 4 and only leaves a small zone 6, placed above the region 3, exposed. The oxide of the zone 6 which is not protected is then removed by chemical etching so as to expose the silicon therebelow and make the subsequent production of a direct contact to the n-channel transistor to be formed in the region 3 possible.

Figure 3:
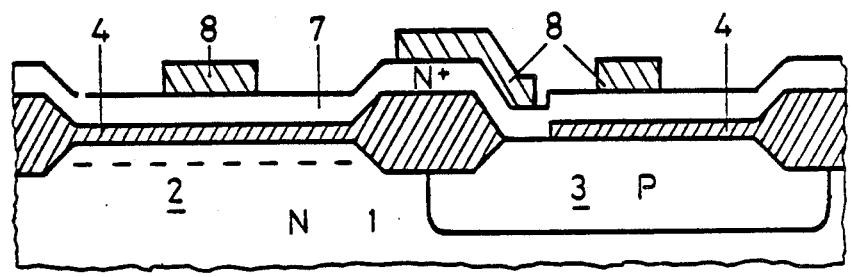

The protective mask of photoresist is then removed and using the conventional technique called CVD (Chemical Vapour Deposition), there is formed a layer 7 of polycrystalline silicon (FIG. 3) which is doped, using the known process of diffusion, with n-type impurities, for example phosphorus, at a very high concentration (N+).

Figure 4:
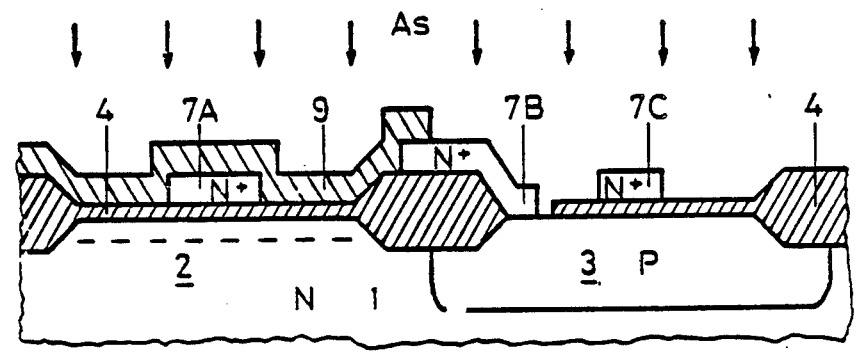

There is then formed a mask 8 of photoresist on certain zones of the layer 7 of polycrystalline silicon and the unprotected portions of this layer are removed by means of selective chemical etching such that above the layer 4 of silicon dioxide, the regions 2 and 3 are superimposed respectively by the portions of polycrystalline silicon 7A and 7C (FIG. 4) and, above the silicon of the region 3, which has been exposed by the window opening in the oxide, there is the portion of the polycrystalline silicon 7B. The portions 7A, 7C and 7B of polycrystalline silicon respectively constitute the gate electrode of the p-channel transistor, the gate electrode of the n-channel transistor and the drain electrode of the n-channel transistor.

Figure 5:
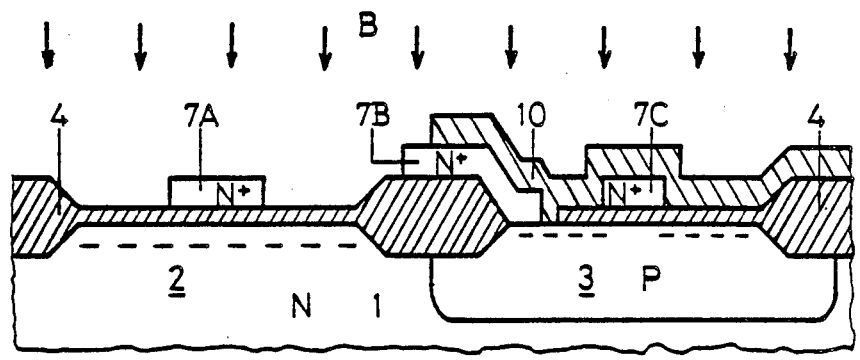

The mask 8 is then removed and a further mask of photoresist 9 is formed and covers the entire surface of the region 2 and, in a manner known to persons skilled in the art, a doping agent of n-type, for example arsenic (As), is introduced into the silicon of region 3 by ion implantation, with sufficient energy to pass solely through the gate dielectric disposed above the region 3 and not covered by polycrystalline silicon. The presence of the doping agent N is shown by dashed lines in FIG. 5.

The mask 9 is then removed, and a further mask 10 of photoresist is formed and covers the entire surface of region 3 and a doping agent of p-type, for example boron (B) is introduced into the silicon of region 2 by ion implantation with a sufficient energy to pass solely through the gate dielectric disposed above region 2 and not covered by the polycrystalline silicon.

Figure 6:
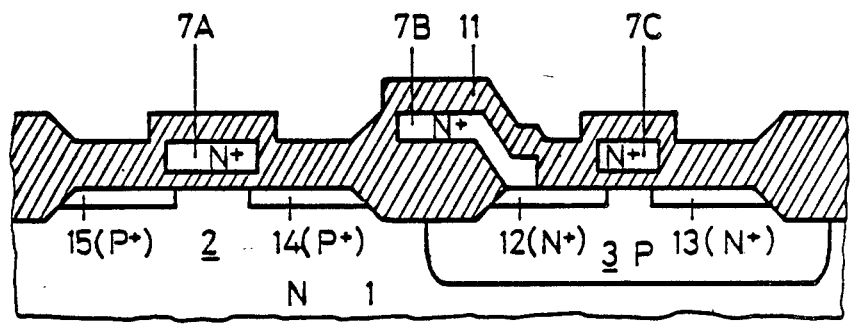

The mask 10 is then removed and the wafer is exposed to a high temperature (approximately 1000° C.)

for a period sufficient to enable the drive-in of the n and p doping agents, previously implanted in regions 3 and 2 respectively, and to form a relatively thick layer 11 of silicon dioxide (FIG. 6). This exposure to high temperature also enables an improved diffusion of the n-type doping agent in the polycrystalline silicon in particular in the direct contact zone. This doping agent being diffused in the silicon of region 3 in contact with the polycrystalline silicon portion 7B. In region 3 there is therefore obtained two diffused n-type regions 12 and 13 having a high concentration of doping agent (N+) which respectively form the drain and source regions of the n-channel transistor and, in region 2, two p-type diffused regions 14 and 15 having a high concentration of doping agent (P+) which respectively form the drain and source regions of the p-channel transistor.

In the structure shown in FIG. 6, which is produced using the method described above, both the transistors have a low threshold (between $-0.7$ and $-1$ V for the p-channel transistor and 0.7 and 1 V for the n-channel transistor), although this is obtained by using different measures for two transistors, i.e. by doping the polycrystalline silicon of the gate electrode with N+ for the n-channel transistor so as to provide the latter with a negative $V_{FB}$ and in the case of the p-channel transistor by providing a low concentration of n-type impurities in the region 2 in which it is formed. In this way, however, as can be seen from the drawings, the distance between the drain and source regions of the p-channel transistor cannot be reduced in the same way as the distance between the drain and source regions of the n-channel transistor (which is approximately 2 5 $\mu m$), which obviously leads to dimensions and response times which are greater for the p-channel transistor. In addition as the polycrystalline silicon is doped with N+, there cannot be direct contact between the polycrystalline silicon and p-type substrate regions such as for example the drain region 14 of the p-channel transistor.

FIGS. 7 to 13 which show the various stages of the improved method of the invention are now explained.

Figure 7:
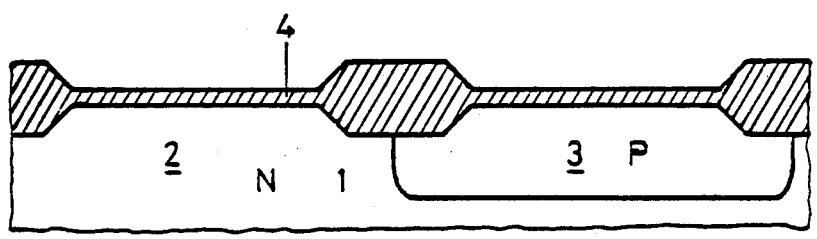
FIGS. 7 to 13 are cross-sections relating to the method of the invention and the inventive structure produced from the method.
Figure 8:
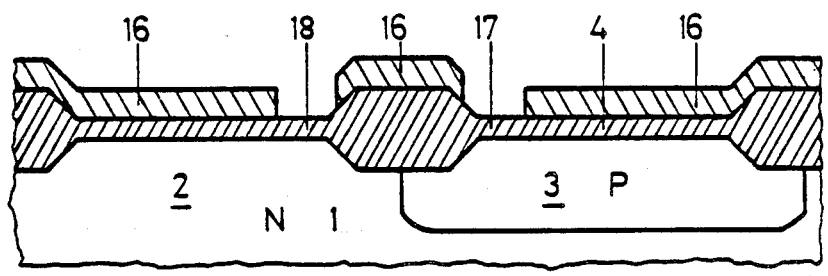
Figure 9:
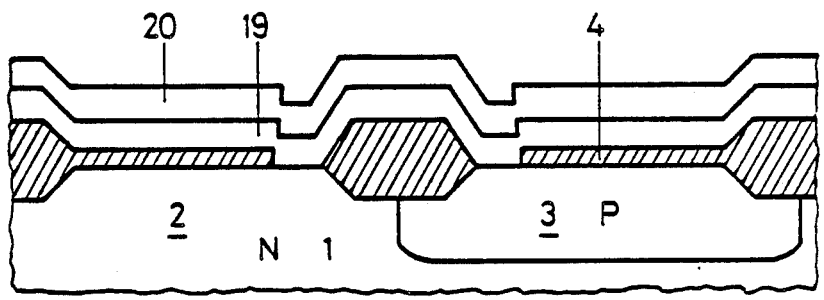
Figure 10:
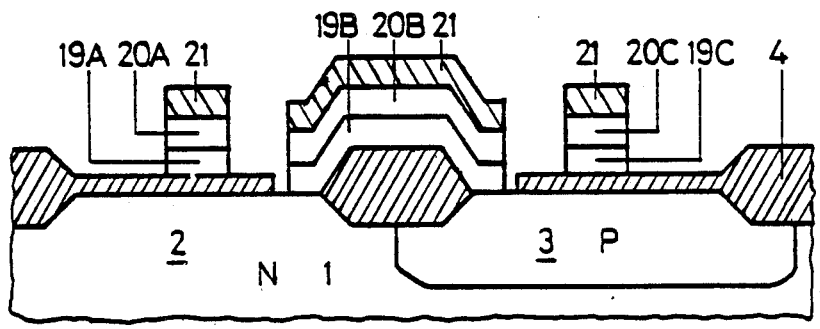
Figure 11:
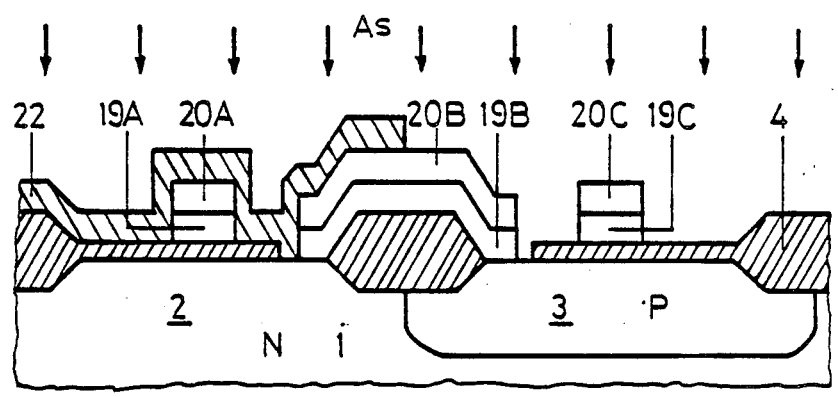
Figure 12:
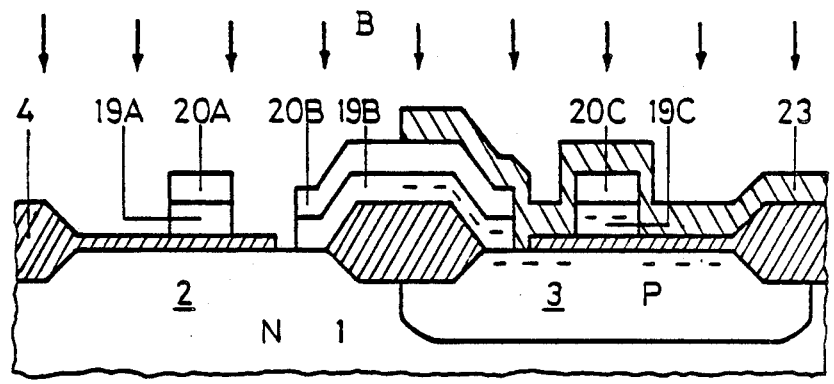

The structure shown in FIG. 7 is similar to that of FIG. 1, as it also comprises a substrate 1 of monocrystalline silicon doped with n-type impurities in which there is formed a region 2 designed to receive the p-channel transistor of a CMOS, and in which there is formed a region 3 doped with p-type impurities in which the n-channel transistor of the CMOS is obtained, and in which there is also a layer 4 of silicon dioxide which covers the substrate 1 and the thicker portion of which constitutes the field dielectric and the thinner portion the gate dielectric. However the structure of FIG. 7 differs from that of FIG. 1 in that the concentration of doping agent of n-type in region 2 is comparatively high, typically from $4 \times 10^{15}$ to $5 \times 10^{15}$ atoms/cm$^3$ which may be obtained, as is known, either by using a substrate already having a high concentration of n-type doping agent or by using a substrate having a low concentration of n-type doping agent, in which the surface doping is increased by implanting n-type impurities. This enables the achievement of a small distance between the active regions even for the p-channel transistor.

On this structure there is formed a mask of photoresist 16 (FIG. 8) which almost completely covers the layer of oxide 4 and only leaves exposed two small zones 17 and 18 disposed respectively above the regions 3 and 2. The oxide of the zones 17 and 18 which is not protected is removed by chemical etching so as to expose the silicon therebelow and make it possible to provide a subsequent direct contact on the drain regions of the two CMOS transistors.

The protective mask 16 is then removed and a layer of polycrystalline silicon 19 (FIG. 9) is formed by CVD techniques and, above this layer, a layer 20 of metal silicide, such as tantalum, for example using the technique called sputtering. There is then formed a mask of photoresist 21 on certain zones of the silicide layer 20 and the non-protected portions of this layer and the portions of the layer of polycrystalline silicon lying therebelow are removed, for example by selective chemical etching such that above the layer 4 of silicon dioxide the two regions 2 and 3 are superimposed by strips of polycrystalline silicon and silicide, respectively 19A, 20A and 19C, 20C (FIG. 10) and, above the silicon of regions 2 and 3, which has been exposed by the opening of the two windows in the oxide, there is a strip of polycrystallaline silicon 19B and, above this, a strip of silicide 20B.

The mask 21 is then removed and a further mask of photoresist 22 (FIG. 11) is formed and covers the entire surface of region 2. By means of an ion implantation operation, a doping agent of n-type, for example arsen'c (As), is introduced into the silicon of region 3 and into the polycrystalline silicon of the strip 19C and part of the strip 19B. Use is made of an implantation energy of between 60 and 200 KeV which enables the doping agent to pass through the non-protected portions of the gate oxide and the non-protected portions of the silicide (the strip 20C and part of 20B), but prevents it from penetrating into the gate oxide disposed below the polycrystalline silicon strips 19C and 19B.

The mask 22 is then removed and a further mask of photoresist 3 (FIG. 12) is formed and covers the entire surface of the region 3. By means of an ion implantation operation a p-type doping agent, for example boron (B), is introduced into the silicon of the region 3 and into the strip of polycrystalline silicon 19A and into part of the strip 19B. Use is made of an implantation energy of approximately 40 KeV which, as in the case of the implantation of the n-type doping agent described above, enables the doping agent to pass through the non-protected portions of the gate oxide and the non-protected portions of the silicide (the strip 20A and part of 20B), but does not enable it to penetrate into the gate oxide disposed below the strips of polycrystalline silicon 19A and 19B.

Figure 13:
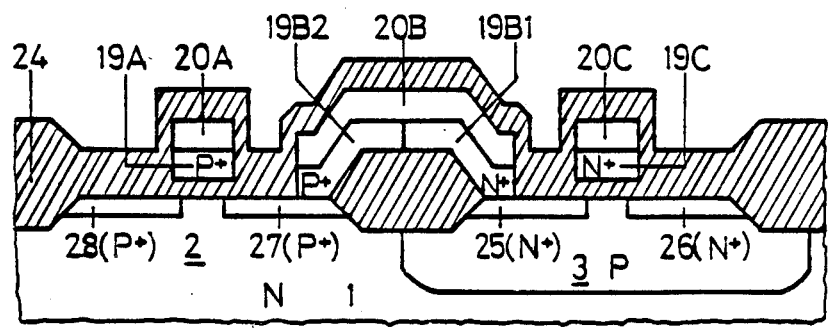

The mask 23 is then removed and the wafer is exposed to a high temperature (approximately 10000° C.) for a period sufficient to enable the drive-in of the n-type and p-type doping agents previously implanted and to form a relatively thick layer 24 of silicon dioxide (FIG. 13). The doping agents implanted in the portions of polycrystalline silicon 19B2 and 19B1 are in particular diffused in the monocrystalline zones lying beneath them and with which they are in contact. There is therefore obtained, in region 3, two diffused regions of n-type 25 and 26 having a high concentration of doping agent (N+) which respectively form the drain and source regions of the n-channel transistor and, in region 2, two diffused regions of p-type 27 and 28, having a high concentration of doping agent (P+) which respectively form the drain and source regions of the p-channel transistor.

In the structure of the invention, shown in FIG. 13, the gate and drain electrodes of the two transistors are formed by two superimposed strips of polycrystalline silicon and silicide. In fact, the gate and drain electrodes of the n-channel transistor are respectively formed by the heavily doped n-type polycrystalline silicon strips (N+) 19C and 19B1 above which there are respectively the silicide strips 20C and 20B and the gate and drain electrodes of the p-channel transistor are respectively formed by the heavily doped p-type polycrystalline strips (P+) 19A and 19B2, above which there are the respective silicide strips 20A and 20B.

Thus, in the structure of the invention, the polycrystalline silicon of the gate electrode of the p-channel transistor is doped with p-type impurities. In this way there is obtained for this transistor both a low threshold, since $V_{FB}$ is positive and a small distance between the active regions 27 and 28, as it is possible to keep the concentration of n-type doping agent of region 2 which receives the transistor high. In addition, it is possible to obtain direct contacts between the polycrystalline silicon and the p-type monocrystalline silicon. In the structure described above, a direct contact is in particular provided to the drain region of the p-channel transistor. It can therefore be seen that the diode which is formed in the strip of polycrystalline silicon 19B which is doped partly with n-type impurities (19B1) and partly with p-type impurities (19B2) does not lead to problems as it is shortcircuited by the silicide strip 20B superimposed thereon. In the structure of the invention it is therefore possible to connect together electrodes of polycrystalline silicon doped with impurities of opposing types, without the use of aluminium connection bridges which would be detrimental to the compactness of the structure.

Although a single embodiment of the structure and method of the invention has been described and illustrated, it is obvious that a number of variants and modifications may be made without departing from the scope of the invention. For example, the diffusion designed to form the active elements of the two transistors of the CMOS may be carried out in two separate stages, one following the implantation of n-type impurities, in order to form the active elements 19C, 19B1, 25 and 26 of the n-channel transistor and the other following the implantation of p-type impurities in order to form the active elements 19A, 19B2, 27 and 28 of the p-channel transistor. In addition, it is possible to use doping methods other than ion implantation, and masking materials other than photoresist.

In addition, the invention may be used with any type of CMOS method. The invention may be used, for example, with the methods known as "N-well", "twin-tab" and "epitaxial" in addition to the P-well method described above which involves the formation, within a substrate of n-type, of a p-type diffused region (3), designed to receive the n-channel transistor of the CMOS. These processes respectively involve the formation within a p-type substrate of an n-type diffused region for the p-channel transistor (N-well process), the formation, within an n-type or p-type substrate, with a low doping level, of two diffused regions of n-type and p-type respectively for the p-channel and the n-channel transistors (twin-tab process), and the formation of of an epitaxial substrate of $n^-$ type on a substrate of $n^+$ type (or $p^-$ on $p^+$) (epitaxial method, generally combined with the twin-tab process).

The above description is intended to illustrate the preferred embodiment and is not meant to limit the scope of the invention. The scope of the invention is to be limited only by the following claims. From the above description, many variations will be apparent to one skilled in the art and would yet be encompassed by the spirit and scope of the invention.

We claim:

1. A method for forming N-channel and P-channel CMOS transistors having a low threshold voltage in a common silicon substrate, comprising the steps of:
    depositing a layer of polysilicon over said substrate;
    depositing a layer of metal silicide over said layer of polysilicon;
    forming mutually superimposed regions of said polysilicon layer and said metal silicide layer;
    implanting through superimposed regions of said metal silicide layer to provide a P-type polycrystalline silicon gate region and a P-type substrate region for said P-channel MOS transistor; and
    implanting through superimposed regions of said metal-silicide layer to provide an N-type gate region and a N-type substrate region for said N-channel MOS transistor.

2. The method according to claim 1, wherein said implanting steps also form self-aligned N-channel and P-channel MOS transistors.

3. The method according to claim 1, further including thermally oxidizing said superimposed portions of said metal silicide layer.

4. The method according to claim 1, further including forming a superimposed portion of said polysilicon layer directly on said substrate to couple said P-channel MOS transistor and said N-channel MOS transistor.

5. A method for forming CMOS devices having low threshold voltages in a common substrate, comprising the steps of:
    forming a layer of polysilicon on said substrate;
    forming a layer of metal silicide on said layer of polysilicon;
    forming a pattern in said polysilicon layer and in said silicide layer so that said patterned polysilicon layer everywhere underlies said silicide layer; and
    implanting through said silicide layer to form complementary-doped gates for said CMOS devices and to form complementary source-drain regions in said substrate, said source-drain regions being contacted by said patterned polysilicon layer.

* * * * *